(12) United States Patent
Chiu

(10) Patent No.: US 6,987,406 B1
(45) Date of Patent: Jan. 17, 2006

(54) WIDE FREQUENCY RANGE PHASE-LOCKED LOOP CIRCUIT WITH PHASE DIFFERENCE

(75) Inventor: Hon K. Chiu, Hayward, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/847,105

(22) Filed: May 17, 2004

(51) Int. Cl.
H03L 7/06 (2006.01)

(52) U.S. Cl. .......................... 327/156; 331/11
(58) Field of Classification Search .................. None
See application file for complete search history.

(56) References Cited

U.S. PATENT DOCUMENTS

| | | | | |
|---|---|---|---|---|
| 4,940,952 A | * | 7/1990 | Kegasa | .................. 331/11 |
| 5,950,115 A | * | 9/1999 | Momtaz et al. | ............... 455/73 |
| 6,307,413 B1 | * | 10/2001 | Dalmia et al. | .............. 327/166 |
| 6,566,967 B1 | * | 5/2003 | Anumula et al. | ............. 331/11 |
| 6,642,747 B1 | | 11/2003 | Chiu | |
| 6,683,930 B1 | * | 1/2004 | Dalmia | ...................... 375/376 |

* cited by examiner

Primary Examiner—Timothy P. Callahan
Assistant Examiner—Cassandra Cox
(74) Attorney, Agent, or Firm—Darby & Darby P.C.; Matthew M. Gaffney

(57) ABSTRACT

A PLL circuit is arranged to provide a wide capture range, and to lock the leading edge of the feedback signal with the center of the reference clock pulse. The PLL circuit includes a charge pump circuit, a loop filter circuit, a VCO circuit, a PFD circuit, a phase detector circuit, a frequency comparator circuit, and a multiplexer circuit. The frequency comparator circuit is configured to compare the frequency of the reference clock with the frequency of the feedback signal, and to provide a status signal based on the comparison. The comparison is a determination of whether the frequencies of the reference clock and the feedback signal are within a tolerance window. Further, the multiplexer circuit selects either the PFD output or the phase detector output based on the comparison. The PFD is employed to bring the frequencies of the feedback signal and the reference clock signal within the tolerance window.

20 Claims, 7 Drawing Sheets

WIDE FREQUENCY RANGE PHASE-LOCKED LOOP CIRCUIT WITH PHASE DIFFERENCE

FIELD OF THE INVENTION

The invention is related to phase-locked loops, and in particular, to a phase-locked loop circuit with a wide capture range that aligns the leading edge of the feedback signal with the center of the reference clock pulse.

BACKGROUND OF THE INVENTION

Phase-locked loop (PLL) circuits are useful in many electronic systems. For example, PLL circuits may be used for master clock generation for a microprocessor system, clock generation for a sampling clock in an analog-to-digital conversion system, clock generation for data recovery in a low-voltage differential signal (LVDS) driver/receiver system, cathode ray tube (CRT) displays, as well as numerous other applications.

PLL applications typically provide an output clock signal by comparing the output clock signal to a reference clock signal. A phase-frequency detector (PFD) circuit is often employed to provide a raw control signal to a loop filter. The phase-frequency detector circuit provides the raw control signal in response to comparing the phase and frequency of the output clock signal to the reference clock signal. The loop filter often is a low-pass filter (LPF) that is arranged to provide a smoothed or averaged control signal in response to raw control signal. Typically, a voltage-controlled oscillator (VCO) is arranged to receive the control signal from the loop filter. The VCO produces the clock signal in response to the control signal such that the frequency of the clock is varied until the phase and frequency of the clock signal are matched to the reference clock signal.

A PLL circuit may include a PFD circuit that provides UP and DOWN signals in response to the comparison between the output clock signal and the reference clock signal. The UP and DOWN signals are dependent on both the phase and frequency of the output and reference clock signals. The UP signal is active when the frequency of the output clock signal is lower than the reference signal, while the DOWN signal is active when the frequency of the output clock signal is determined to be higher than the reference signal. Similarly, the UP signal is active when the phase of the output clock is lagging behind the phase of the reference clock, and the DOWN signal is active when the phase of the output clock is leading the phase of the reference clock.

BRIEF DESCRIPTION OF THE DRAWINGS

Non-limiting and non-exhaustive embodiments of the present invention are described with reference to the following drawings, in which.

DETAILED DESCRIPTION

Figure 1:
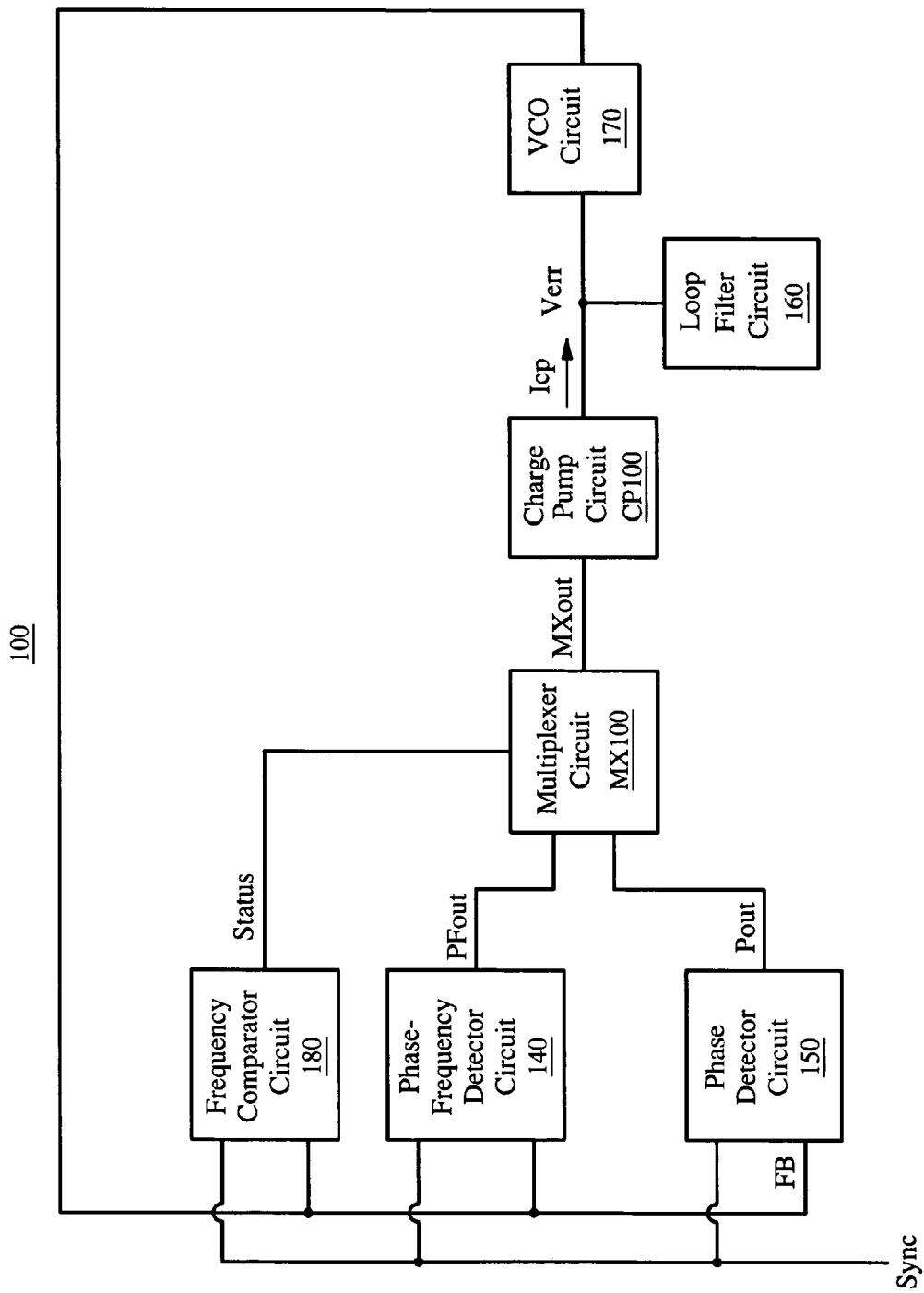
FIG. 1 illustrates a block diagram of an embodiment of a PLL circuit.

Various embodiments of the present invention will be described in detail with reference to the drawings, where like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

Throughout the specification and claims, the following terms take at least the meanings explicitly associated herein, unless the context clearly dictates otherwise. The meanings identified below are not intended to limit the terms, but merely provide illustrative examples for the terms. The meaning of "a," "an," and "the" includes plural reference, and the meaning of "in" includes "in" and "on." The phrase "in one embodiment," as used herein does not necessarily refer to the same embodiment, although it may. The term "coupled" means at least either a direct electrical connection between the items connected, or an indirect connection through one or more passive or active intermediary devices. The term "circuit" means at least either a single component or a multiplicity of components, either active and/or passive, that are coupled together to provide a desired function. The term "signal" means at least one current, voltage, charge, temperature, data, or other signal.

Briefly stated, the invention is related to a PLL circuit is arranged to provide a wide capture range, and to lock the leading edge of the feedback signal with the center of the reference clock pulse. The PLL circuit includes a charge pump circuit, a loop filter circuit, a VCO circuit, a PFD circuit, a phase detector circuit, a multiplexer circuit, and a frequency comparator circuit. The frequency comparator circuit is configured to compare the frequency of the reference clock with the frequency of the feedback signal, and to provide a status signal based on the comparison. The comparison is a determination of whether the frequencies of the reference clock and the feedback signal are within a tolerance window. Further, the multiplexer circuit selects either the PFD output or the phase detector output based on the comparison. The PFD is employed to bring the frequencies of the feedback signal and the reference clock signal within the tolerance window.

Once the frequencies are within the tolerance window, the status signal changes logic levels. This causes the multiplexer to select the phase detector output instead of the PFD output. The charge pump circuit is arranged to receive the output of the multiplexer circuit.

FIG. 1 illustrates a block diagram of an embodiment of PLL circuit 100. PLL circuit 100 includes multiplexer circuit MX100, charge pump circuit CP100, loop filter circuit 160, VCO circuit 170, frequency comparator circuit 180, PDF circuit 140, and phase detector circuit 150.

Phase detector circuit 150 is arranged to provide phase detection output signal Pout in response to input clock signal Sync and feedback signal FB. Input clock signal Sync may be a reference clock signal. Also, phase detector circuit 150 may be configured to provide signal Pout such that, if signal Pout is received by charge pump circuit CP100, and signals Sync and FB are within a capture range of phase detector circuit 150, the operation of PLL circuit 100 adjusts signal FB toward causing a constant phase difference between signals Sync and FB.

Additionally, PFD circuit 140 is arranged to provide phase-frequency detection output signal PFout in response to signals Sync and FB. PFD circuit 140 may be configured to provide signal PFout such that, if signal PFout is receive by charge pump circuit CP100, the operation of PLL circuit 100 adjusts signal FB towards causing the phase and frequency of signals Sync and FB to become substantially the same.

Frequency comparator circuit 180 may be arranged to provide signal Status such that signal Status corresponds to a first logic level if a frequency that is associated with signal Sync and a frequency that is associated with signal FB are within a tolerance window, and such that signal Status corresponds to a second logic level if the frequency that is associated with signal Sync and the frequency that is associated with signal FB are outside of the tolerance window. Further, multiplexer circuit MX100 is arranged to provide signal MXout such that signal PFout is selected as signal MXout if signal Status corresponds to the first logic level, and such that signal Pout is selected as signal MXout if signal Status corresponds to the second logic level.

Also, charge pump circuit CP100 is configured to provide charge pump current Icp responsive to signal MXout. Loop filter circuit 160 is arranged to provide error signal Verr in response to current Icp. VCO circuit 170 is arranged to provide an oscillator output signal from signal Verr. In one embodiment, the oscillator output signal is signal FB. In one embodiment, signal FB is based, in part, on the oscillator output signal.

Figure 2:
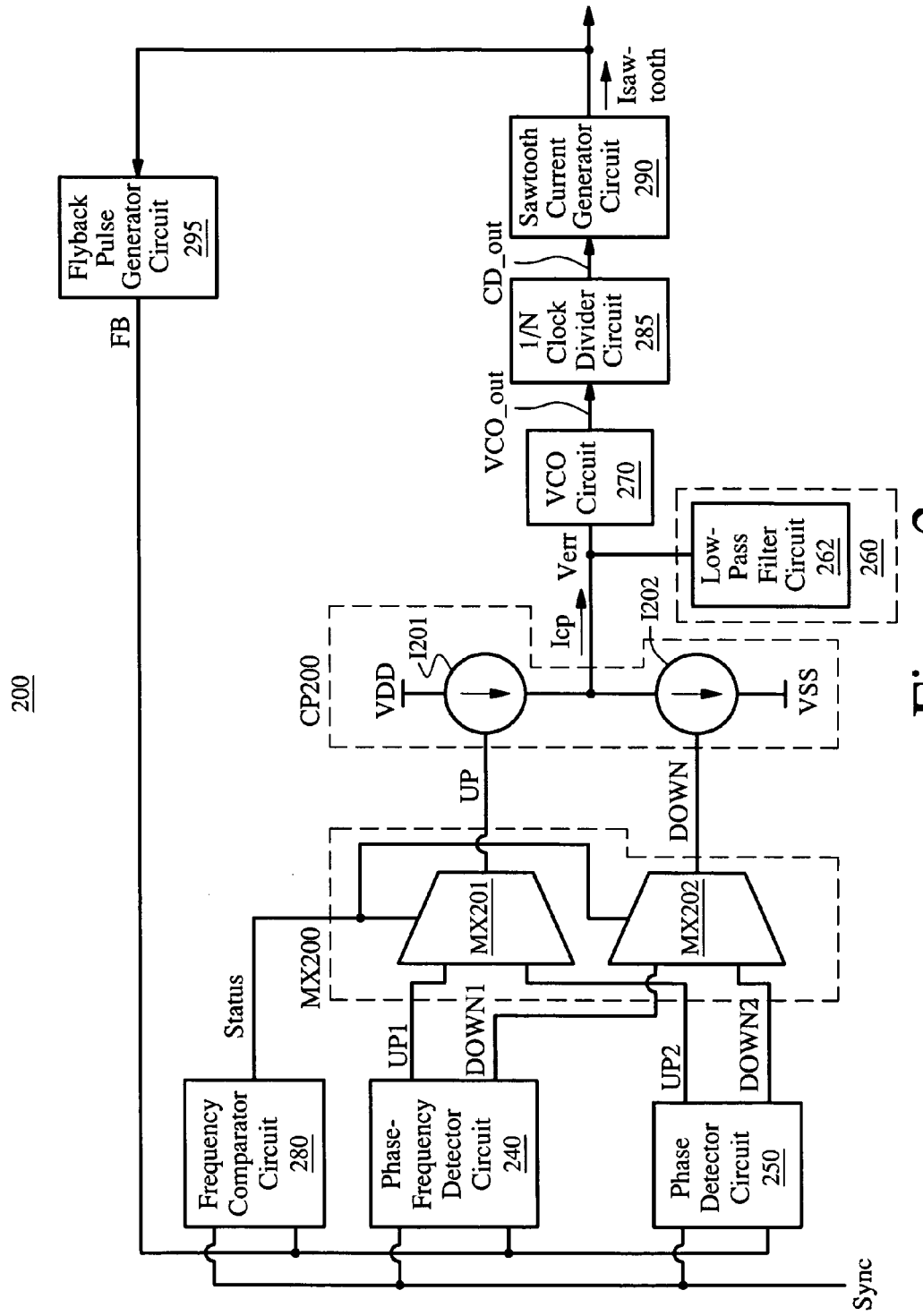
FIG. 2 shows a block diagram of an embodiment of the PLL circuit of FIG. 1.

FIG. 2 shows a block diagram of an embodiment of PLL circuit 200. Components in PLL circuit 200 may operate in a substantially similar manner to similarly-named components in PLL circuit 100, and may operate in a different manner in some ways. PLL circuit 200 may further include 1/N clock divider circuit 285, sawtooth current generator circuit 290, and flyback pulse generator circuit 295. Multiplexer circuit MX200 includes multiplexer MX201 and multiplexer MX202. Charge pump circuit CP200 includes current source I201 and current sink I202. Loop filter circuit 260 includes low pass filter circuit 262.

In one embodiment, PLL circuit 200 is employed for horizontal deflection for a CRT display. In other embodiments, PLL circuit 200 may be employed for other applications.

PFD circuit 240 is arranged to provide a phase-frequency detection output signal that includes signals UP1 and DOWN1. Phase detector circuit 250 is arranged to provide a phase detection output signal that includes signals UP2 and DOWN2. Phase detector circuit 250 is arranged to provide signal UP2 such that signal UP2 corresponds to an active logic level if signal FB corresponds to the second logic level and the input clock signal corresponds to the second logic level, and corresponds to an inactive logic level otherwise. Further, phase detector circuit 250 is arranged to provide signal DOWN2 such that signal DOWN2 corresponds to the active logic level if signal FB corresponds to the second logic level and the input clock signal corresponds to the first logic level, and corresponds to the inactive logic level otherwise.

Additionally, multiplexer MX201 is arranged to multiplex signals UP1 and UP2 responsive to signal Status, and multiplexer MX202 is arranged to multiplex signals DOWN1 and DOWN2 responsive to signal Status. More specifically, signal UP2 is selected as signal UP by multiplexer MX201 if signal Status corresponds to the first logic level, and signal UP1 is selected as signal UP by multiplexer MX201 if signal Status corresponds to the second logic level. Similarly, signal DOWN2 is selected as signal DOWN by multiplexer MX202 if signal Status corresponds to the first logic level, and signal DOWN1 is selected as signal DOWN by multiplexer MX201 if signal Status corresponds to the second logic level.

Current source I201 is arranged to provide a source current as current Icp if signal UP corresponds to an active logic level, and to provide substantially no current if signal UP corresponds to an inactive logic level. Similarly, current sink I202 is arranged to provide a sink current as current Icp if signal DOWN corresponds to an active logic level, and to provide substantially no current if signal DOWN corresponds to an inactive logic level.

Also, VCO circuit 270 is arranged to provide oscillator output signal VCO_out from signal Verr such that a frequency that is associated with signal VCO_out is associated with a voltage that is associated with signal Verr. Further, 1/N clock divider circuit 285 is arranged to provide signal CD_out by dividing a frequency that is associated with signal VCO_out. In one embodiment, 1/N clock divider circuit 285 includes a counter. Additionally, sawtooth waveform generator circuit 290 may be arranged to provide sawtooth current Isawtooth from signal CD_out. Current Isawtooth has a slow rise time and a fast fall time. In one embodiment, at least a portion of current Isawtooth is provided to a deflection yoke of a CRT display for horizontal deflection of the CRT display. Also, in one embodiment, at least a portion of current Isawtooth is provided to flyback pulse generator circuit 295. Flyback pulse generator circuit 295 may be arranged to provide signal FB from the at least the portion of current Isawtooth that is received by flyback pulse generator circuit 295. Signal FB may be substantially similar to signal CD_out, except that signal FB has a low duty cycle, and has a temperature-dependent propagation delay relative to signal CD_OUT.

During the operation of PLL circuit 200, if the frequencies associated with signals Sync and FB are not within the tolerance window, signals UP1 and DOWN1 are selected as signals UP and DOWN. Accordingly, the feedback operation of PLL circuit 200 causes the phase and frequency of signals FB to come closer to the phase and frequency of signal Sync, until the frequencies of signals FB and Sync are within the tolerance window. When the frequencies of signals FB and Sync are within the tolerance window, signals UP2 and DOWN2 are selected as signals UP and DOWN. Accordingly, the feedback operation of PLL circuit 200 may cause the center of an active (i.e. high) pulse signal FB to lock to the leading edge of signal Sync. In one embodiment, signal Sync is a reference clock signal that is derived from a horizontal synchronization signal.

In one embodiment, by aligning the center of the pulse of signal FB to the leading edge of signal Sync, the sawtooth current is properly aligned. In this embodiment, the center of the fall time of the sawtooth current corresponds to the center of the picture provided on the CRT display. Accordingly, in this embodiment, the picture provided by the CRT display appears in the center of the sweep, regardless of temperature variations. Also, in this embodiment, the center frequency of VCO circuit 270 need not be adjusted when the frequency associated with signal Sync changes.

Figure 3:
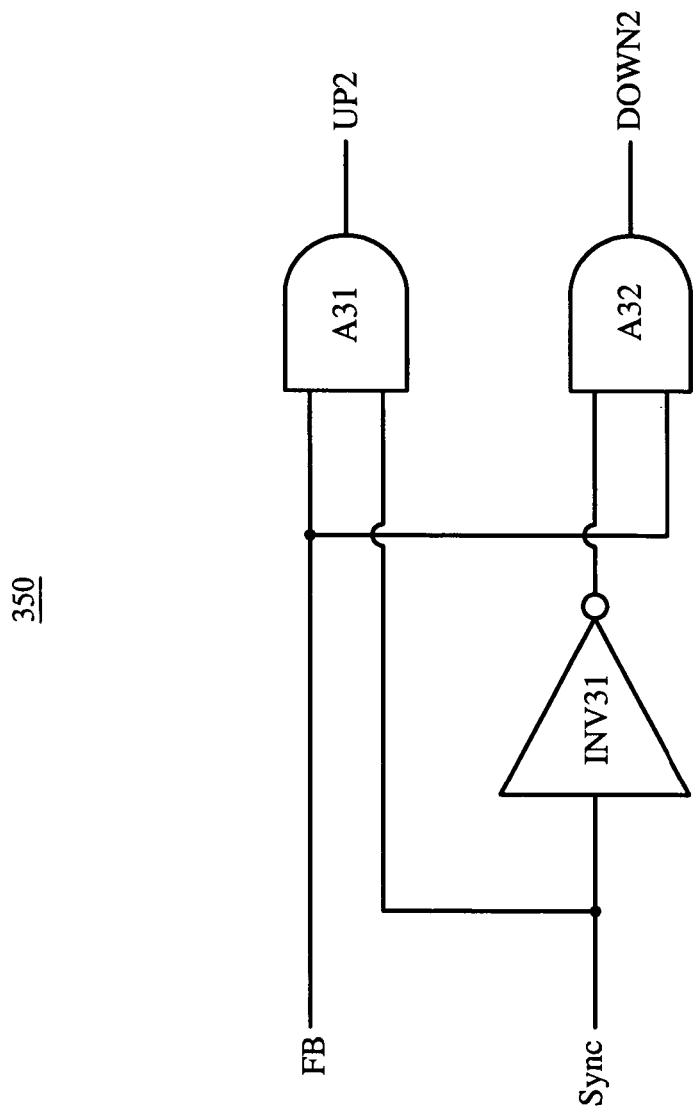
FIG. 3 schematically illustrates an embodiment of the phase detector circuit of FIGS. 1 and 2.

FIG. 3 schematically illustrates an embodiment of phase detector circuit 350. Phase detector circuit 350 may operate in a substantially similar manner as described with regard to phase detector circuit 250 of FIG. 2, and may operate in a different manner in some ways. Phase detector circuit 350 includes AND gates A31 and A32, and inverter INV31.

Figure 4:
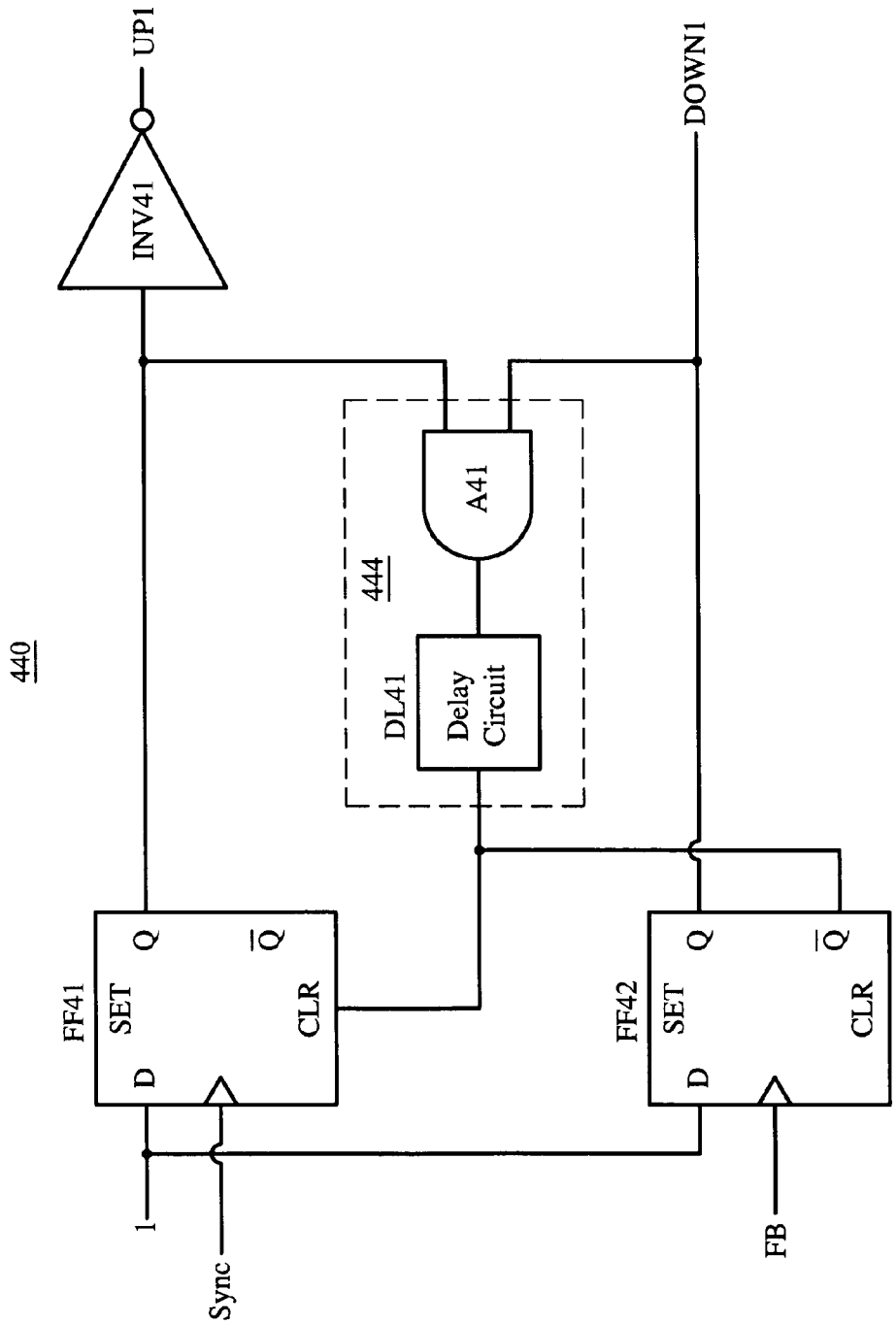
FIG. 4 shows a block diagram of an embodiment of the PFD circuit of FIGS. 1 and 2.

FIG. 4 shows a block diagram of an embodiment of PFD circuit 440. PFD circuit 440 may operate in a substantially similar manner as described with regard to PFD 240 of FIG. 2, and may operate in a different manner in some ways. PFD circuit 440 includes flip-flops FF41–42, inverter INV 41, and clear logic circuit 444. In one embodiment, clear logic circuit 444 includes AND gate A41 and delay circuit DL41.

Figure 5:
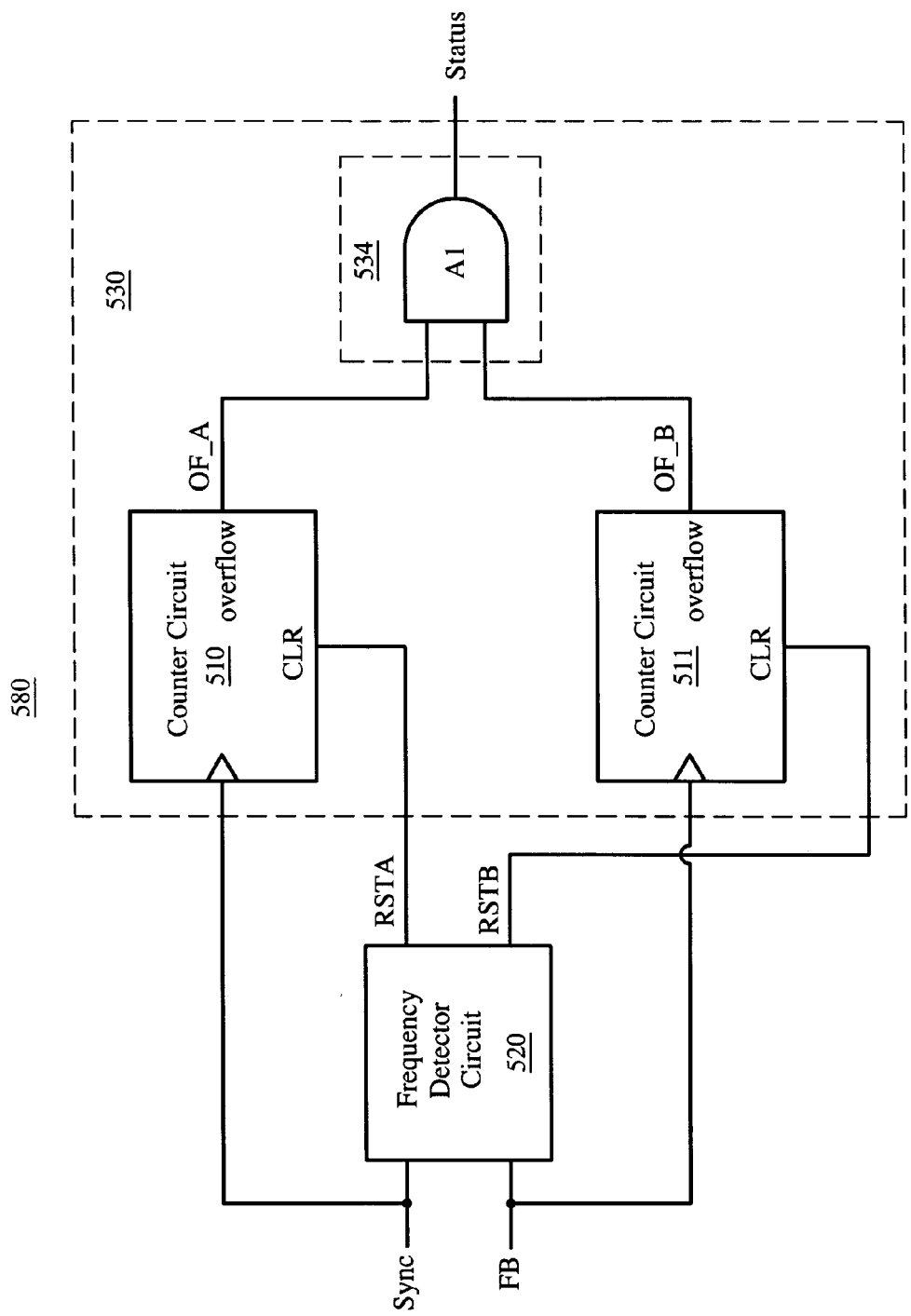
FIG. 5 illustrates a block diagram of an embodiment of the frequency comparator circuit of FIGS. 1 and 2.

FIG. 5 illustrates a block diagram of an embodiment of frequency comparator circuit 580. Frequency comparator circuit 580 includes frequency detector circuit 520 and tolerance circuit 530. An embodiment of tolerance circuit 530 includes counter circuit 510, counter circuit 511, and logic circuit 534. In one embodiment, logic circuit 534 includes AND gate A1.

In operation, frequency detector circuit 520 is configured to provide first reset signal RSTA and second reset signal RSTB from signals Sync and FB.

In one embodiment, frequency detector circuit 520 is configured to provide signals RSTA and RSTB as follows. If fIN1>fIN2, signal RSTA has a first parameter that is related to fIN1–fIN2, where fIN1 and fIN2 are the frequencies that are associated with signals Sync and FB, respectively. Alternatively, if fIN1<fIN2, signal RSTB has a second parameter that is related to fIN2–fIN1.

In one embodiment, if fIN1≧fIN2, fRSTB is substantially zero, where fRSTB is the frequency that is associated with signal RSTB. In one embodiment, if fIN1≦fIN2, fRSTA is substantially zero, where fRSTA is the frequency that is associated with signal RSTA.

In one embodiment, at least if 2*fIN2>fIN1>fIN2, fRSTA is substantially equal to fIN1–fIN2. In one embodiment, at least if 2*fIN1<fIN2<fIN1, fRSTB is substantially equal to fIN2–fIN1. The difference between fIN1 and fIN2 is the beat frequency of signals Sync and FB.

Tolerance circuit 530 is configured to provide a status signal (Status) from signals IN1, IN2, RSTA, and RSTB. Further, tolerance circuit 530 is configured to provide signal Status such that signal Status corresponds to a first logic level if the difference between the fIN1 and fIN2 are within a tolerance window, and to a second logic level otherwise. In one embodiment, tolerance circuit 530 is arranged to provide signal Status as follows.

Counter circuit 510 is arranged to receive signal Sync at a clock input of counter circuit 510, and counter circuit 511 is arranged to receive signal FB at a clock input of circuit 511. Further, counter circuit 510 is arranged to increment a first count value when a positive edge occurs in signal Sync. Similarly, counter circuit 511 is arranged to increment a second count value when a positive edge occurs in signal Sync. Although a positive edge triggered condition is described, in other embodiments, counter circuits 510 and 511 may be triggered by a negative edge, level-triggered, and the like.

Additionally, counter circuit 510 is arranged to reset the first count value (e.g. to zero) if signal RSTA is asserted. Similarly, counter circuit 511 is arranged to reset the second count value (e.g. to zero) if signal RSTB is asserted.

Further, counter circuit 510 is configured to provide a first overflow signal (OF_A) at an overflow output such that signal OF_A is asserted if counter circuit 510 overflows. Similarly, counter circuit 511 is configured to provide a second overflow signal (OF_B) at an overflow output of counter circuit 511 such that signal OF_B is asserted if counter circuit 511 overflows.

In one embodiment, counter circuit 510 overflows if fIN1<fIN2+tol1, and counter circuit 511 overflows if fIN2<fIN1+tol2. Accordingly, in this embodiment, counter circuits 510 and 511 both overflow if fIN1–fIN2<tol1 and fiN2–fIN1<tol2. Also, AND gate A1 is arranged to provide signal Status by performing an AND function on signals OF_A and OF_B. Accordingly, signal Status has a high logic level if fIN1 and fIN2 are within the tolerance window of each other, and has a low logic level otherwise. In other embodiments, AND gate A1 may be replaced with another circuit that is configured to provide signal Status using the same truth table as an AND gate, and the like. In one embodiment, tol1 is substantially given by fIN1/(M1*[fIN1–fN2]), where M1 is the maximum count value of counter circuit 510. Similarly, in one embodiment, tol2 is substantially given by fIN2/(M2*[fIN2–fIN1]), where M2 is the maximum count value of counter circuit 511.

In one embodiment, tol1 and tol2 provide the tolerance window, where tol1 is an upper tolerance value for fIN1, and tol2 is a lower tolerance value for fIN1.

Figure 6:
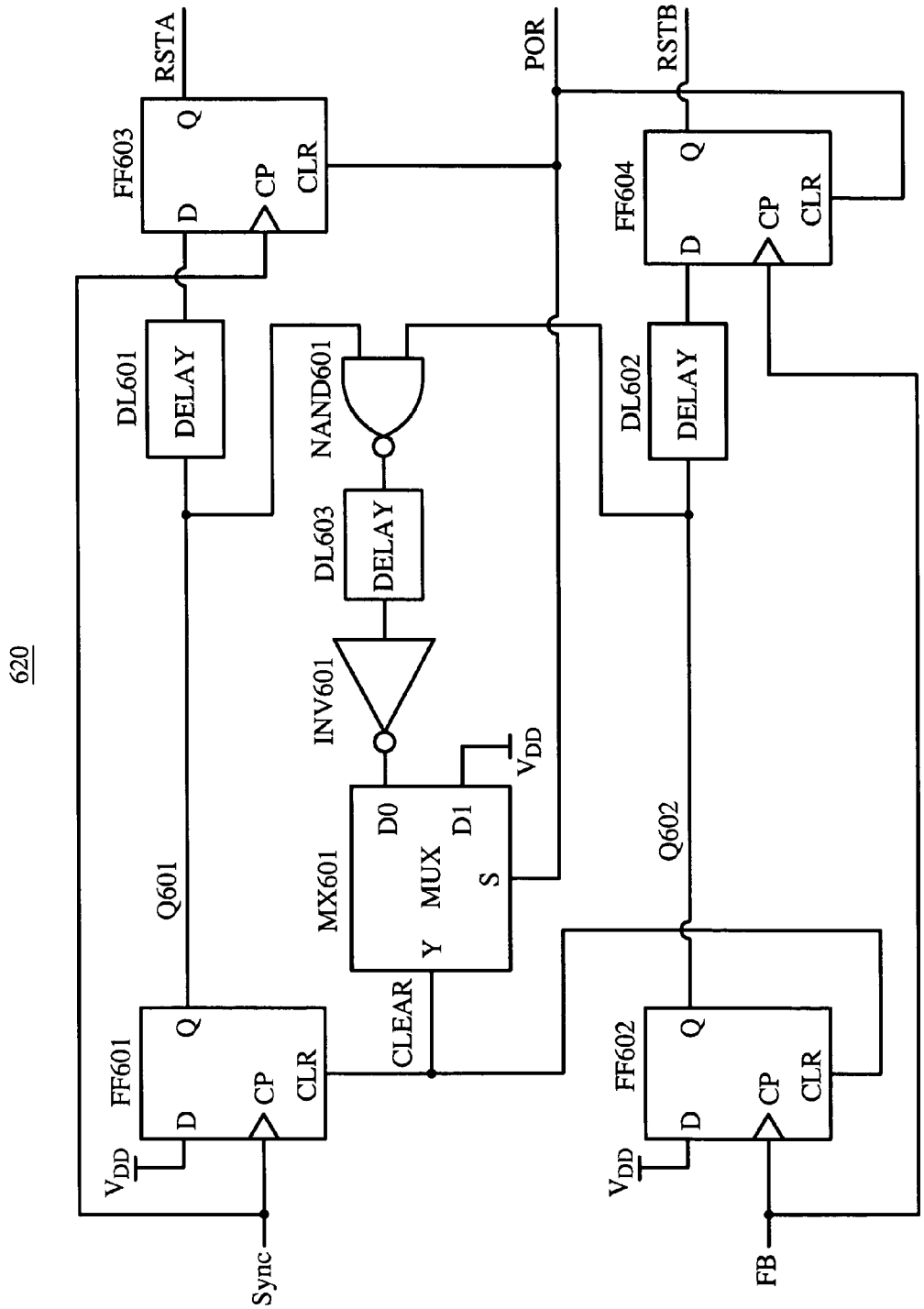
FIG. 6 shows a block diagram of an embodiment of the frequency detector circuit of FIG. 5.

FIG. 6 shows a block diagram of an embodiment of frequency detector circuit 620. Frequency detector circuit 620 may operate in a substantially similar manner as frequency detector circuit 520, and may operate differently in some ways. Frequency detector circuit 620 includes flip-flops FF601–FF604 and a clear logic circuit. In one embodiment, the clear logic circuit includes delay circuits DL601–DL603, NAND gate NAND601, inverter INV601, and multiplexer MX201.

The clear logic circuit may be arranged to activate a clear signal (CLR) if signal Q601 and signal RSTA correspond to a first logic level, and arranged to deactivate signal CLEAR if at least one of signal Q601 and signal RSTA corresponds to a second logic level. FF601 may be arranged to set signal Q601 to the first logic level in response to signal Sync if signal CLEAR is deactivated, and arranged to reset signal Q601 to the second logic level if signal CLEAR is activated. FF602 may be arranged to set signal RSTA to the first logic level in response to signal FB if signal CLEAR is deactivated, and arranged to reset signal RSTA to the second logic level if signal CLEAR is activated. FF603 may be arranged to activate signal RSTA in response to signal Sync if signal Q601 corresponds to the first logic level, such that signal RSTA is activated if signal Sync pulses twice before signal CLEAR is activated. FF604 may be arranged to activate signal RSTB in response to signal FB if signal RSTA corresponds to the first logic level, such that signal RSTB is activated if signal FB pulses twice before signal CLEAR is activated.

Frequency detector circuit 620 is arranged such that signals RSTA and RSTB are dependent on fIN1 and fIN2, and such that signals RSTA and RSTB are substantially independent of the phases of signals Sync and FB.

If fNI1≧fIN2, fRSTB is substantially zero. Similarly, if fIN1≦fIN2, fRSTA is substantially zero.

If 2*fIN2>fIN1>fIN2, then FRSTA is substantially given by fIN1–fIN2, and the duty cycle of signal RSTA is substantially 50%. If fIN1>2*fIN2, signal RSTA behaves in a similar manner, except that, occasionally, a pulse of signal RSTA has a pulse duration of 2/fIN1 instead of 1/fIN1. If fiN1>>fN2, fRSTA is substantially the same as fIN2, and the duty cycle of signal RSTA is substantially given by (fIN1–fIN2)/fIN1.

Similarly, if 2*fIN1>fIN2>fIN1, then fRSTB is substantially given by fIN2–fIN1, and the duty cycle of signal RSTB is substantially 50%. If fiN2>2*fIN1, RSTB behaves in a similar manner, except that, occasionally, a pulse of signal fRSTB has a pulse duration of 2/fIN2 instead of 1/FIN2. If fIN1<<fIN2, fRSTB is substantially the same as fIN1, and the duty cycle of signal RSTB is substantially given by (fIN2−fIN1)/fIN2.

Referring back to FIG. 5, in one embodiment, circuit 500 includes counter circuits 510 and 511, further includes frequency detector circuit 620 as an embodiment of frequency detector circuit 520, and counter circuits 510 and 511 are both C bit counters. In this embodiment, if fIN1 and fIN2 are within a $\frac{1}{2_c}$ tolerance of each other, signal Status is high. Otherwise, signal Status is low. This may be more readily understood through the following mathematical calculations.

If 2*fIN2>fIN1>fIN2, in order for a pulse to occur in signal RSTA for a duration of (N−1) pulses of signal FB, at least N pulses must occur in signal Sync. The Nth pulse of signal Sync must happen sooner than the (N−1)th pulse of signal FB in order to propagate a logic 1 at signal RSTA (i.e. two consecutive pulses of signal Sync with no pulse of signal FB in between).

Accordingly, N*TA<(N−1)*TB, where TA and TB are the periods of signal Sync and signal FB respectively.

=>TB<N*TB−N*TA

=>TB/(TB−TA)<N

=>(1/fIN2)/(1/fIN2−1/fIN1)<N

=>fIN1/(fIN1−fIN2)<N

=>(fIN1−fIN2)/fIN1>1/N, for generating a pulse at signal RSTA during the (N)th pulse of signal Sync, i.e. (fIN1−fIN2)/fIN1≦1/N, for no pulse to be generated at signal RSTA during the (N)th pulse of signal Sync.

For example, if C is 5, 32 pulses of signal Sync can overflow the counter. However, if there is one pulse of signal RSTA before 32 consecutive pulses of signal Sync occur, counter 110 does not overflow. If fIN1>2*fIN2, signal Sync does not remain low long enough for counter 110 to overflow. Accordingly, if (fIN1−fIN2)/fIN1≦1/32, counter circuit 110 overflows.

Similarly, if (fIN2−fIN1)/fIN2≦1/32, counter circuit 111 overflows. If counter circuits 110 and 111 both overflow, fIN2 and fIN1 are similar, within ±1/32 tolerance. If counter circuits 110 and 111 both overflow, signal Status corresponds to logic 1.

The time duration, TRSTA, between two single pulses of signal RSTA if fIN1 and fIN2 are close and fIN1>fIN2, is given by

TRSTA/TA−TRSTA/TB=1

=>TRSTA*fIN1−TRSTB*fIN2=1

=>TRSTA=1/(fIN1−fIN2)

=>fRSTA=(fIN1−fIN2)

Figure 7:
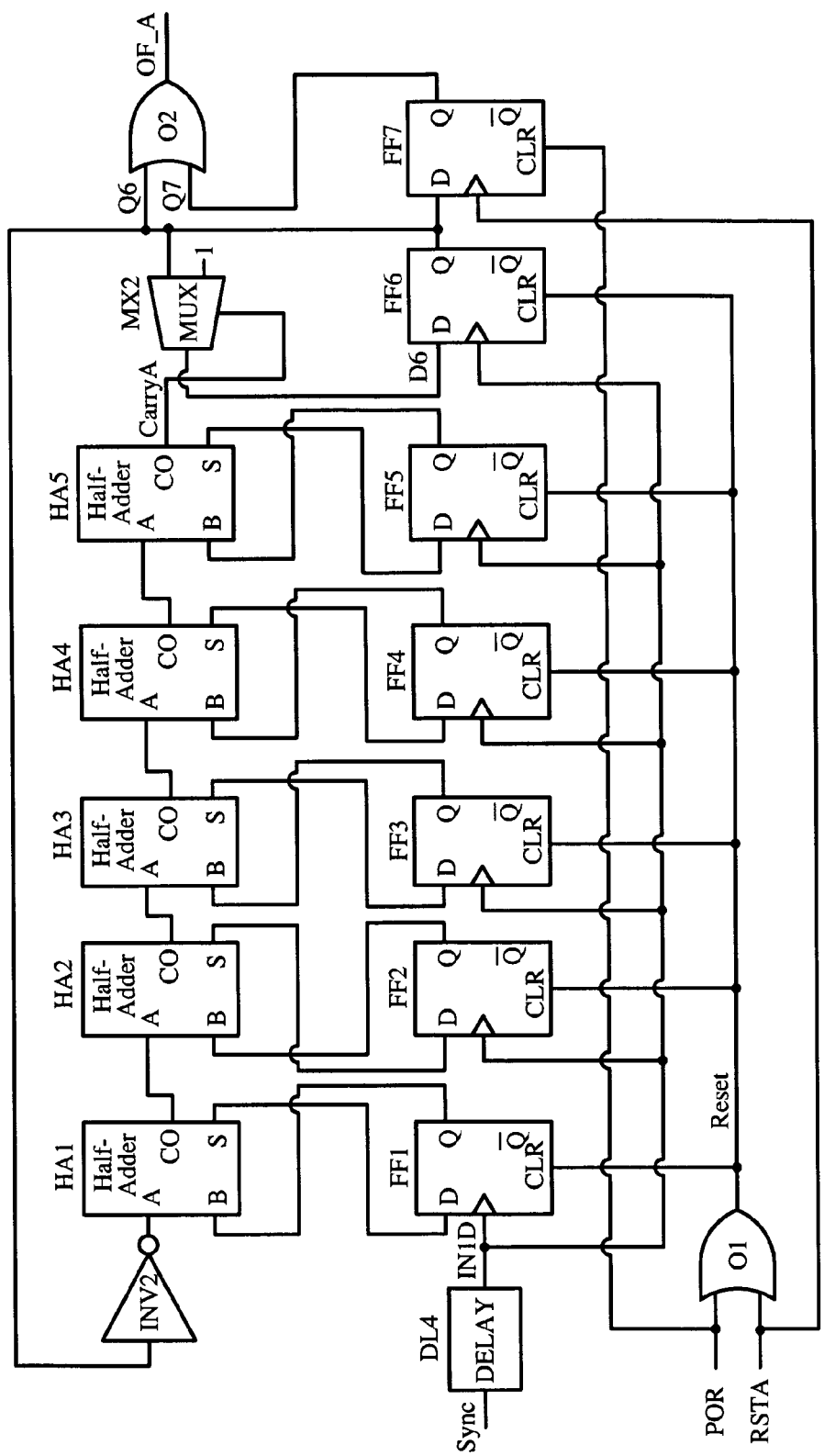
FIG. 7 illustrates a block diagram of an embodiment of one of the counter circuits of FIG. 5, arranged in accordance with aspects of the invention.

FIG. 7 illustrates a block diagram of an embodiment of counter circuit 710. Counter circuit 710 may operate in a substantially similar manner as counter circuit 510, and may operate differently in some ways. Counter circuit 511 may be arranged in a substantially similar manner to counter circuit 710. Counter circuit 710 may include flip-flops FF1–FF7, half-adders HA1–HA5, OR gates O1–O2, inverter INV2, multiplexer MX2, and delay circuit DL4.

Delay circuit DL4 is configured to provide signal IN1D from signal Sync. FF1–FF5 are arranged as a register that is configured to store the first count value. Additionally, the register is arranged to be clocked by signal IN1D. HA1–HA5 and INV2 are arranged as a look-ahead logic circuit. Also, OR gate circuit O1 is configured to provide signal Reset from signal POR and signal RSTA.

FF6 and MX2 are arranged to operate as follows. MX2 is arranged to provide signal D6 from signal Q6 such that, when FF6 is clocked, signal D6 has the same logic level as signal Q6 if signal carryA is low, and such that signal D6 is high if signal carryA is high. Signal carryA is high only if counter 710 overflows. Additionally, Q6 is reset to low if signal Reset is high. Accordingly, Q6 is set high only when counter circuit 710 overflows, and only remains high until signal Reset is high.

FF7 is arranged to store the overflow condition. Also, OR gate O2 is arranged to provide signal OF_A such that signal OF_A is high if either Q6 or Q7 are high. If the overflow condition occurs, carryA changes to high, which in turn causes Q6 to change to high, as previously described. Since Q6 is high, OF_A is high. Next, when signal Reset changes to high, Q6 is changed to low, and Q7 is changed to high. At this point, OF_A remains high, since Q7 is high. Q7 remains high until the next leading edge of signal Reset, which causes Q7 to change back to low.

As discussed, FF7 and OR gate O2 are used to temporarily store the overflow condition. If fIN1 is greater than fIN2, even if signal fIN1 is very close to fIN2, signal RSTA still has an occasional pulse. FF7 and OR gate O2 are arranged to prevent Status from immediately changing to low if this happens.

Although one embodiment of counter circuit 710 is described above for illustrative purposes, other embodiments of counter circuit 710 are within the scope of the invention.

The above specification, examples and data provide a description of the manufacture and use of the composition of the invention. Since many embodiments of the invention can be made without departing from the spirit and scope of the invention, the invention also resides in the claims hereinafter appended.

What is claimed is:

1. A phase-locked loop circuit, comprising:
   a phase-frequency detector circuit that is arranged to provide a phase-frequency detection output signal in response to an input clock signal and a feedback signal that is based, in part, on a multiplexer output signal;
   a phase detector circuit that is arranged to provide a phase detection output signal in response to the input signal and the feedback signal;
   a frequency comparator circuit that is arranged to provide a status signal such that the status signal corresponds to a first logic level if a frequency that is associated with the input clock signal and a frequency that is associated with the feedback signal are within a tolerance window, and such that the status signal corresponds to a second logic level if the frequency that is associated with the input clock signal and the frequency that is associated with the feedback signal are outside of the tolerance window; and
   a multiplexer circuit that is arranged to provide the multiplexer output signal such that the phase-frequency detection output signal is selected as the multiplexer output signal if the status signal corresponds to the first logic level, and such that the phase detection output signal is selected as the multiplexer output signal if the status signal corresponds to the second logic level.

2. The phase-locked loop circuit of claim 1, wherein the phase detection output signal includes a phase up signal and a phase down signal, and wherein the phase detector circuit is arranged to provide the phase detection output signal such that:

the phase up signal corresponds to an active logic level if the feedback signal corresponds to the second logic level and the input clock signal corresponds to the second logic level, and corresponds to an inactive logic level otherwise, and the phase down signal corresponds to the active logic level if the feedback signal corresponds to the second logic level and the input clock signal corresponds to the first logic level, and corresponds to the inactive logic level otherwise.

3. The phase-locked loop circuit of claim 1, further comprising a charge pump circuit, wherein the phase detection output signal includes a phase up signal and a phase down signal, the phase-frequency detection output signal includes a phase-frequency up signal and a phase-frequency down signal, the multiplexer output signal includes a multiplexer up signal and a multiplexer down signal, and wherein the charge pump circuit is arranged to provide a charge pump output signal such that the charge pump output signal includes a source current if the multiplexer up signal corresponds to an active logic level, and such that the charge pump output signal includes a sink current if the multiplexer down signal corresponds to the active logic level.

4. The phase-locked loop circuit of claim 1, wherein the phase-frequency detector circuit includes:

a first flip-flop circuit that includes a first flip-flop output, a first flip-flop clear input, and a first flip-flop clock input, wherein the first flip-flop circuit is arranged to receive the input clock signal at the first flip-flop clock input;

a second flip-flop circuit that includes a second flip-flop output, a second flip-flop clear input, and a second flip-flop clock input, wherein the second flip-flop circuit is arranged to receive the input clock signal at the second flip-flop clock input; and a clear logic circuit that is coupled to the first and second flip-flop outputs and the first and second flip-flop clear inputs.

5. The phase-locked loop circuit of claim 1, further comprising:

a charge pump circuit that is arranged to provide a charge pump output signal responsive to the multiplexer output signal; and a voltage-controlled oscillator circuit that is arranged to provide an oscillator output signal from a signal that is based, in part, on the charge pump output signal, wherein the feedback signal is based, in part, on the multiplexer output signal.

6. The phase-locked loop circuit of claim 5, further comprising:

a low-pass filter circuit that is arranged to provide a filter output signal from the charge pump output signal, wherein the voltage-controlled oscillator circuit is arranged to provide the oscillator output signal from the filter output signal such that a frequency that is associated with the oscillator output signal is associated with a voltage that is associated with the filter output signal;

a clock divider circuit that is arranged to provide a clock divider output signal by dividing a frequency that is associated with oscillator output signal;

a sawtooth current generator circuit that is arranged to provide a sawtooth current from the clock divider output signal; and a flyback pulse generator circuit that is arranged to provide the feedback signal from a signal that is based, in part, on the sawtooth current.

7. The phase-locked loop circuit of claim 1, wherein the frequency comparator circuit includes:

a frequency detector circuit that is configured to provide first and second reset signals from the input clock signal and the feedback signal such that:

if a first frequency that is associated with the input clock signal is greater than a second frequency that is associated with the feedback signal, the first reset signal includes a first parameter that is related to a difference between the first and second frequencies, and if the first frequency is less than the second frequency, the second reset signal includes a second parameter that is related to the difference between the first and second frequencies; and a tolerance circuit that is arranged to provide a status signal from the input clock signal, the feedback signal, and the first and second reset signals.

8. The phase-locked loop circuit of claim 7, wherein the frequency detector circuit includes a clear logic circuit that is arranged to activate a clear signal if a first intermediate signal and a second intermediate signal correspond to the first logic level, and arranged to deactivate the clear signal if at least one of the first intermediate signal and the second intermediate signal corresponds to the second logic level;

a first flip-flop circuit that is arranged to set the first intermediate signal to the first logic level in response to the input clock signal if the clear signal is deactivated, and arranged to reset the first intermediate signal to the second logic level if the clear signal is activated;

a second flip-flop circuit that is arranged to set the second intermediate signal to the first logic level in response to the feedback signal if the clear signal is deactivated, and arranged to reset the second intermediate signal to the second logic level if the clear signal is activated;

a third flip-flop circuit that is arranged to activate the first reset signal in response to the input clock signal if the first intermediate signal corresponds to the first logic level, such that the first reset signal is activated if the input clock signal pulses twice before the clear signal is activated; and a fourth flip-flop circuit that is arranged to activate the second reset signal in response to the feedback signal if the second intermediate signal corresponds to the first logic level, such that the second reset signal is activated if the feedback signal pulses twice before the clear signal is activated.

9. The phase-locked loop circuit of claim 7, wherein the tolerance circuit includes:

a first counter circuit that is configured to generate a first count from the first input signal, to reset the first count if the first reset signal corresponds to an asserted logic level, and to provide a first overflow signal such that the first overflow signal is asserted if a first overflow condition has occurred, wherein the first overflow condition is related to the first count; and a second counter circuit that is configured to generate a second count from the second input signal, to reset the second count if the second reset signal corresponds to an asserted logic level, and to provide a second overflow signal such that the second overflow signal is asserted if a second overflow condition has occurred, wherein the second overflow condition is related to the second count; and a logic circuit that is configured to provide the status signal such that the status signal corresponds to:
the second logic level, if the first and second overflow signals are both asserted, and
the first logic level, if less than both of the first and second overflow signals are asserted.

10. The phase-locked loop circuit of claim 9, wherein the first counter circuit is configured to store the first overflow condition, and wherein the second counter circuit is configured to store the second overflow condition.

11. A phase-locked loop circuit, comprising:
a phase-frequency detector circuit that includes a first phase-frequency input, a second phase-frequency input that is coupled to a feedback node, and a phase-frequency output;
a phase detector circuit that includes first and second phase inputs and a phase output, wherein the first phase input is coupled to the first phase-frequency input, and wherein the second phase input is coupled to the feedback node;
a frequency comparator circuit that includes first and second frequency inputs and a frequency output, wherein the first frequency input is coupled to the first phase input, and wherein the second frequency input is coupled to the feedback node;
a multiplexer circuit that includes a first multiplexer input that is coupled to the phase-frequency output, a second multiplexer input that is coupled to the phase output, a select input that is coupled to the frequency output, and a multiplexer output;
a charge pump circuit that is coupled to the multiplexer output; and
a voltage-controlled oscillator circuit that is coupled between the charge pump circuit and the feedback node.

12. The phase-locked loop circuit of claim 11, wherein the phase-frequency detector circuit includes:
a first flip-flop circuit that includes a first flip-flop output, a first flip-flop clear input, and a first flip-flop clock input that is coupled to the first phase input;
a second flip-flop circuit that includes a second flip-flop output, a second flip-flop clear input, and a second flip-flop clock input that is coupled to the feedback node; and
a clear logic circuit that is coupled to the first and second flip-flop outputs and the first and second flip-flop clear inputs.

13. The phase-locked loop circuit of claim 11, wherein the phase output includes a phase up output and a phase down output, the phase detection circuit is arranged to provide a phase up signal at the phase up output such that the phase up signal corresponds to an active logic level if the feedback signal corresponds to the active logic level and the input clock signal corresponds to the active logic level, and corresponds to an inactive logic level otherwise, and further arranged to provide a phase down signal at the phase down output such that the phase down signal corresponds to the active logic level if the feedback signal corresponds to the active logic level and the input clock signal corresponds to the inactive logic level, and corresponds to the inactive logic level otherwise.

14. The phase-locked loop circuit of claim 11, wherein the phase detector circuit is arranged to provide a phase up signal and a phase down signal at the phase output; the phase-frequency detector circuit is arranged to provide a phase-frequency up signal and a phase-frequency down signal at the phase-frequency output; the frequency comparator circuit is arranged to provide a status signal at the frequency output; the multiplexer circuit is arranged to provide a multiplexer output signal at the multiplexer output such that the multiplexer output signal includes a multiplexer up signal and a multiplexer down signal, the phase-frequency up signal and the phase-frequency down signal are selected as the multiplexer up signal and the multiplexer down signal respectively if the status signal corresponds to a second logic level, and such that the phase up signal and the phase down signal are selected as the multiplexer up signal and the multiplexer down signal respectively if the status signal corresponds to a second logic level; the charge pump circuit is arranged to provide a charge pump current such that the charge pump current is related to average logic levels of the multiplexer up signal and the multiplexer down signal; and wherein the voltage-controlled oscillator circuit is arranged to provide an oscillator output signal in response to a signal that is based on the charge pump current, and further arranged such that the phase-frequency detector circuit, the phase detector circuit, frequency comparator circuit each receive a feedback signal at the feedback node, and such that the feedback signal is based, in part, on the oscillator output signal.

15. The phase-locked loop circuit of claim 11, further comprising:
a low-pass filter circuit that is coupled to the charge pump circuit and the voltage-controlled oscillator circuit;
a clock divider circuit that is coupled between the voltage-controlled oscillator circuit and the feedback node;
a sawtooth current generator circuit that is coupled between the clock division circuit and the feedback node; and
a flyback pulse generator circuit that is coupled between the sawtooth current generator circuit and the feedback node.

16. The phase-locked loop circuit of claim 11, wherein the frequency comparator circuit includes:
a frequency detector circuit including a first input that is coupled to the first phase input, a second input that is coupled to the feedback node, and first and second outputs;
a first counter circuit including a clock input that is coupled to the first input of the frequency detector circuit, a clear input that is coupled to the first input of the frequency detector circuit, and a first overflow output;
a second counter circuit including a clock input that is coupled to the second input of the frequency detector circuit, and a clear input that is coupled to the second input of the frequency detector circuit, and a second overflow output; and
a logic circuit including a first input that is coupled to the first overflow output, a second input that is coupled to the second overflow output, and an output that is coupled to the select input.

17. The phase-locked loop circuit of claim 16, wherein the logic circuit is an AND gate.

18. The phase-locked loop circuit of claim 16, wherein the first counter circuit includes:
a register circuit; and
a flip-flop that is arranged to store an overflow condition related to the register circuit, and wherein the frequency comparator circuit further includes a delay circuit that is coupled between the clock input of the frequency detector circuit and the clock input of the register circuit.

19. The phase-locked loop circuit of claim 16, wherein the frequency detector circuit includes:
- a first flip-flop circuit having a clock input that is coupled to the clock input of the first counter circuit;
- a second flip-flop circuit having a clock input that is coupled to the clock input of the second counter circuit;
- a third flip-flop circuit having a clock input that is coupled to the clock input of the first counter circuit, another input that is coupled to an output of the first flip-flop circuit, and an output that is coupled to the clear input of the first counter circuit;
- fourth flip-flop circuit having a clock input that is coupled to the clock input of the second counter circuit, another input that is coupled to an output of the second flip-flop circuit, and an output that is coupled to the clear input of the second counter circuit; and
- a clear logic circuit having a first input that is coupled to the output of the first flip-flop circuit, a second input that is coupled to the output of the second flip-flop circuit, and an output that is coupled to a clear input of the first flip-flop circuit, and further coupled to a clear input of the second flip-flop circuit.

20. A phase-locked loop circuit, comprising:
- means for providing a phase-frequency detection output signal in response to an input clock signal and a feedback signal that is based, in part, on a multiplexer output signal;
- means for providing a phase detection output signal in response to the input signal and the feedback signal;
- means for providing a status signal such that the status signal corresponds to a first logic level if a frequency that is associated with the input clock signal and a frequency that is associated with the feedback signal are within a tolerance window, and such that the status signal corresponds to a second logic level if the frequency that is associated with the input clock signal and the frequency that is associated with the feedback signal are outside of the tolerance window; and
- means for providing the multiplexer output signal such that the phase-frequency detection output signal is selected as the multiplexer output signal if the status signal corresponds to the first logic level, and such that the phase detection output signal is selected as the multiplexer output signal if the status signal corresponds to the second logic level.

* * * * *

UNITED STATES PATENT AND TRADEMARK OFFICE
CERTIFICATE OF CORRECTION

PATENT NO. : 6,987,406 B1  
APPLICATION NO. : 10/847105  
DATED : January 17, 2006  
INVENTOR(S) : Hon Kin Chiu Page 1 of 2

It is certified that error appears in the above-identified patent and that said Letters Patent is hereby corrected as shown below:

Column 3, Line 42, Delete "1201" and insert -- I201 --.

Column 3, Line 42, Delete "1202" and insert -- I202.--.

Column 4, Line 9, Delete "1201" and insert -- I201 --.

Column 4, Line 13, Delete "1202" and insert -- I202 --.

Column 4, Line 38, Delete "CD_OUT." and insert -- CD_out. --.

Column 6, Line 5, Delete "fiN2" and insert -- fIN2 --.

Column 6, Line 14, Delete "fN2])," and insert -- fIN2]), --.

Column 6, Line 54, Delete "fNI1" and insert -- fIN1 --.

Column 6, Line 56, Delete "FRSTA" and insert -- fRSTA --.

Column 6, Line 61, Delete "fiN1>>fN2," and insert -- fIN1>>fIN2, --.

Column 6, Line 66, Delete "fiN2>" and insert -- fIN2> --.

Column 7, Line 2, Delete "1/FIN2." and insert -- 1/fIN2. --.

Column 7, Line 10, Delete "1/2$_c$," and insert -- 1/2$^c$ --.

UNITED STATES PATENT AND TRADEMARK OFFICE
CERTIFICATE OF CORRECTION

PATENT NO.       : 6,987,406 B1
APPLICATION NO.  : 10/847105
DATED            : January 17, 2006
INVENTOR(S)      : Hon Kin Chiu It is certified that error appears in the above-identified patent and that said Letters Patent is hereby corrected as shown below:

Column 7, Line 27 (Approx.), Delete "(1/fIN2)/(1/fN2-1/fIN1)<N" and insert -- (1/fIN2)/(1/fIN2-1/fIN1)<N --.

Signed and Sealed this

Second Day of October, 2007

JON W. DUDAS
*Director of the United States Patent and Trademark Office*